United States Patent
Tsutsui

(10) Patent No.: US 6,610,589 B2
(45) Date of Patent: Aug. 26, 2003

(54) SEMICONDUCTOR LIGHT EMITTING DEVICE AND METHOD OF MANUFACTURING THE SAME

(75) Inventor: Tsuyoshi Tsutsui, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/163,428

(22) Filed: Jun. 7, 2002

(65) Prior Publication Data
US 2002/0145151 A1 Oct. 10, 2002

Related U.S. Application Data

(62) Division of application No. 09/313,970, filed on May 19, 1999, now Pat. No. 6,414,339.

(30) Foreign Application Priority Data

May 25, 1998 (JP) ............................................ 10-143074

(51) Int. Cl.[7] ...................... H01L 21/28; H01L 21/3205
(52) U.S. Cl. .......................... 438/605; 438/34; 438/39; 438/46
(58) Field of Search ............................... 438/22, 29, 34, 438/39, 46, 47, 602, 604, 605

(56) References Cited

U.S. PATENT DOCUMENTS

| | | | | |
|---|---|---|---|---|
| 5,455,461 A | | 10/1995 | Koide et al. ................. 257/784 |
| 5,814,533 A | * | 9/1998 | Shakuda ....................... 438/46 |
| 5,920,766 A | * | 7/1999 | Floyd ........................... 438/35 |
| 6,130,446 A | | 10/2000 | Takeuchi et al. .............. 257/99 |
| 6,326,223 B1 | * | 12/2001 | Miki et al. .................... 438/22 |

* cited by examiner

Primary Examiner—Amir Zarabian
Assistant Examiner—Jamie L. Brophy
(74) Attorney, Agent, or Firm—Arent Fox Kintner Plotkin & Kahn, PLLC

(57) ABSTRACT

A semiconductor lamination including an n-type layer and a p-type layer composed of a gallium nitride based compound semiconductor and forming a light emitting region is formed on the surface of a substrate. A p-side electrode is formed through a diffusion metal layer on the surface of the semiconductor lamination. Also, an n-side electrode is formed on the n-type layer exposed by etching off a part of the semiconductor lamination. The n-side electrode is formed of an ohmic contact electrode and a bonding electrode. The bonding electrode is formed in such a manner as to cover the surface and the sides of the ohmic contact electrode. As a result, a semiconductor light emitting device made of a gallium nitride based compound semiconductor is produced having an electrode structure of a superior ohmic contact characteristic and a superior wire bonding characteristic.

4 Claims, 3 Drawing Sheets

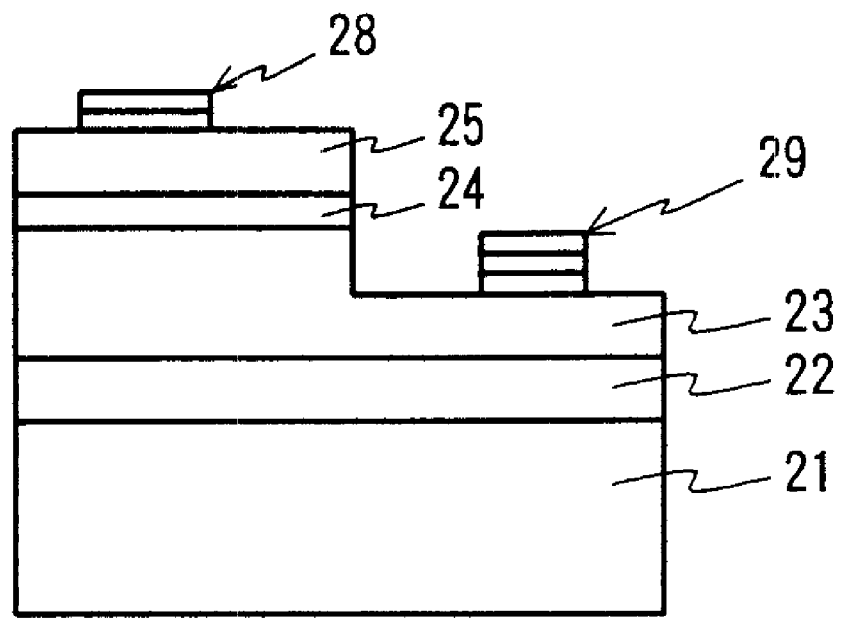

SEMICONDUCTOR LIGHT EMITTING DEVICE AND METHOD OF MANUFACTURING THE SAME

This is a Division of application Ser. No. 09/313,970 filed May 19, 1999. This disclosure of the prior application (s) is hereby incorporated by reference herein in its entirety.

FIELD OF THE INVENTION

The present invention relates to a semiconductor light emitting device including a layer of gallium nitride based compound semiconductor for emitting the light in the bluish color (ultraviolet to yellow) and a method of manufacturing thereof, or more in particular to a semiconductor light emitting device and a method of manufacturing thereof with an improved bonding strength of the wire bonding and the ohmic contact of the electrode provided on an n-type layer.

BACKGROUND OF THE INVENTION

The conventional semiconductor light emitting device for emitting the light in bluish color has a structure shown in FIG. 3, for example. Specifically, on a sapphire substrate 21, a low-temperature buffer layer 22 composed of n-type GaN, an n-type layer (clad layer) 23 with GaN epitaxially grown at high temperature, an active layer (light emitting layer) 24 composed of a material such as InGaN based compound semiconductor (meaning that the compound crystal ratio between In and Ga is variable in many ways, which is true also in the description that follows) which is determined by the desired light emitting wavelength and in such a manner that the band gap energy is smaller than that of the clad layer, and a p-type layer (clad layer) 25 composed of p-type GaN. A p-side electrode 28 is formed on the surface of this semiconductor lamination, and an n-side electrode 29 is formed on the surface of the n-type layer 23 exposed by etching off a part of the semiconductor lamination. In order to improve the effect of confining the carriers, the n-type layer 23 and the p-type layer 25 may be formed of a compound semiconductor layer of AlGaN group (meaning that the ratio between Al and Ga is variable, as in the description that follows) on the active layer 23.

With this structure, the n-type electrode 29, as described in Japanese Patent Publication Unexamined No. HEI 7-45867 and Japanese Patent Publication Unexamined No. HEI 7-254733, is formed of a Ti—Al alloy from the viewpoint of the ohmic contact with the n-type layer or a Ti—Au alloy for preventing the bonding strength from being decreased in view of the fact that Al is easily oxidated, or as described in Japanese Patent Publication Unexamined No. HEI 8-274372 and as shown in FIG. 3, formed of an alloyed lamination of an Al layer, a Ti layer and an Au layer. Further, the p-side electrode 28, as described in Japanese Patent Publication Unexamined No. HEI 8-274372, for example, is formed of a transparent electrode layer (diffusion metal layer) with a lamination of a Ti layer and a Ni layer and an electrode constituting a bonding pad with a lamination of a Ni layer and an Au layer, which are alloyed simultaneously with the n-side electrode.

As described above, when emphasizing the ohmic contact with the n-type layer, the n-side electrode is formed of an Al—Ti alloy, and from the viewpoint of wire bonding, the surface thereof is formed of Au, and this laminated structure is alloyed by heat treatment. However, as described in Japanese Patent Publication Unexamined No. HEI 8-274372, for example, the laminatedly arranged metals are patterned at a time. Thus, Al and Ti formed at the lower part are exposed from the patterned sides. Further, in the case where the Au layer is subjected to heat treatment in contact with Al or Ti for alloying, Al or Ti is diffused in the Au layer and also deposited on the surface of the Au layer. When Al or Ti is exposed, on the other hand, they are liable to be easily oxidated and corroded by water. The problem, therefore, is that aluminum or the like alloyed and exposed by diffusion on the surface of Au or the sides of the electrode are corroded by the water produced from the mold resin covering the surrounding and the reliability is reduced. Further, the deposition and oxidation of Al which may occur on the surface of the Au layer reduces the adhesive power of the wire bonding and deteriorates the reliability of the wire bonding while at the same time reducing the yield. In this way, the conventional semiconductor light emitting device using a gallium nitride based compound semiconductor is liable to pose the problem of the wire bonding and the ohmic characteristic of the n-side electrode.

SUMMARY OF THE INVENTION

The present invention has been developed to solve this problem, and an object of the invention is to provide a semiconductor light emitting device of a gallium nitride based compound semiconductor having an electrode structure superior in both ohmic contact characteristic and wire bonding characteristic.

Another object of the invention is to provide a method of manufacturing a semiconductor light emitting device by which the electrode structure described above can be formed without increasing the manufacturing steps.

Still another object of the invention is to provide a method of manufacturing a semiconductor light emitting device in which the reliability is not reduced by the diffusion of another metal such as Al into the metal of a bonding electrode.

According to the present invention, there is provided a semiconductor light emitting device comprising a substrate, a semiconductor lamination forming a light emitting region including an n-type layer and a p-type layer of gallium nitride based compound semiconductor, and an n-side electrode and a p-side electrode electrically connected to the n-type layer and the p-type layer, respectively, wherein the n-side electrode is formed of an ohmic contact electrode and a bonding electrode, and the bonding electrode covers the surface and the sides of the ohmic contact electrode.

The gallium nitride based compound semiconductor is a semiconductor composed of a compound of the III-group element Ga and the V-group element N, the III-group element Ga partially or wholly replaced by another III-group element such as Al or In, and/or a compound of the V-group element N partially replaced with another V-group element such as P or As.

With this structure, the ohmic contact electrode is completely covered by the bonding electrode, and therefore Al, etc. is not exposed. Even in the case where the surrounding of the electrode is covered with a molding resin, therefore, the electrode is not corroded by the moisture of the resin or the like, and a sufficient reliability is maintained.

At least the outer surface of the bonding electrode is preferably formed of an Au layer from the viewpoint of the corrosion resistance and the bonding characteristic.

The bonding electrode and the p-side electrode, which are formed of the same material, can be efficiently formed at the same time. For example, these component parts are formed of a laminated structure of Ti and Au.

In the case where the contact electrode is made of a Ti—Al alloy, a superior ohmic contact is obtained with the n-type layer.

Specifically, the substrate is formed of sapphire, the portion of the semiconductor lamination forming a light emitting region is made of an InGaN based compound semiconductor sandwitched between the n-type and p-type layers of a gallium nitride based compound semiconductor thereby to form a bluish corol light emitting semiconductor device.

More specifically, the n-type layer is provided nearer to the substrate, and the n-side electrode is formed on the surface of the n-type layer exposed by etching off part of the semiconductor lamination. A diffusion metal layer (transparent electrode) is formed on the surface of the semiconductor lamination. The p-side electrode is formed on the diffusion metal layer. Both the diffusion metal layer and the bonding electrode of the n-side electrode are formed of an alloy layer.

A method of manufacturing a semiconductor light emitting device according to the present invention is characterized in that a semiconductor layer forming a light emitting region including an n-type layer and a p-type layer of gallium nitride based compound semiconductor on a substrate is grown thereby to form a semiconductor lamination. A p-side electrode and an n-side electrode are formed and electrically connected to the p-type layer and the n-type layer, respectively. In the process, an ohmic contact electrode is formed on the surface of the n-type layer, and then a bonding electrode is formed in such a manner as to cover the ohmic contact electrode, while at the same time forming the p-side electrode with the same material and by the same process as the bonding electrode.

By forming the bonding electrode and the p-side electrode of the same material at the same time in this way, the number of manufacturing steps is not increased even in the case where the n-side electrode is divided into the contact portion and bonding protion.

Specifically, an n-type layer, an active layer and a p-type layer are sequentially formed on a substrate thereby to form a semiconductor lamination. By removing a part of the semiconductor lamination, the n-type layer is exposed, and the n-side electrode is formed on the surface of the n-type layer thus exposed.

A metal layer is formed on the semiconductor lamination and alloyed thereby to form a diffusion metal layer. The p-side electrode is formed on the surface of the diffusion metal layer. The contact electrode of the n-side electrode is formed by depositing and alloying metal layers on the n-layer. The process of alloying the diffusion metal layer and the process of alloying the contact electrode are desirably carried out at the same time to minimize the number of steps.

More specifically, a Ti layer and an Al layer for forming the contact electrode are deposited, and a Ni layer and an Au layer for forming the diffusion metal layer are deposited. The Ti—Al layers and Ni—Au layers are heat-treated at the same time for alloying them, respectively. After that, metal films for the bonding electrode and the p-side electrode can be formed at the same time. By doing so, the heat treatment is not required after forming the bonding electrode, and the bonding electrode is not diffused with Al or the like. As a result, the surface of the bonding electrode can be kept clean, and the reliability of wire bonding is not adversely affected or no corrosion by penetration of moisture occurs.

BRIEF DESCRIPTION OF THE DRAWINGS

FIG. 3 is a sectional view for explaining an example of the conventional semiconductor light emitting device.

DETAILED DESCRIPTION

Figure 1:
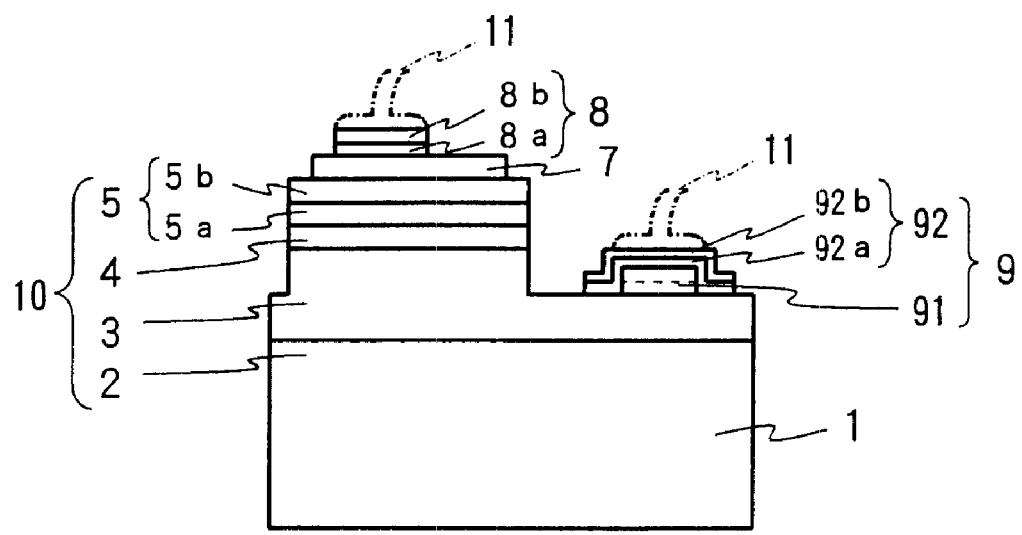
FIGS. 1(a) to 1(b) are sectional views for explaining a semiconductor light emitting device according to an embodiment of the present invention.
Figure 1:
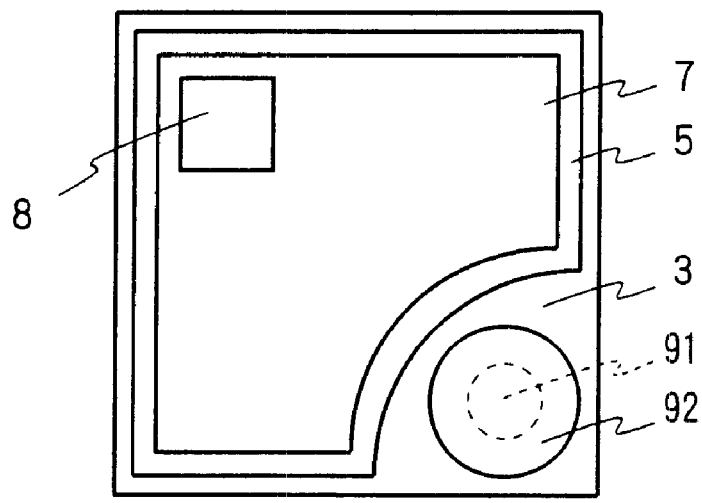

A semiconductor light emitting device according to the present invention, as shown in the sectional and plan views of FIGS. 1(a) and 1(b), a semiconductor lamination 10 forming a light emitting region including an n-type layer 3 and a p-type layer 5 of gallium nitride based compound semiconductor is formed on the surface of a substrate 1 made of sapphire ($Al_2O_3$ single crystal). A p-side electrode 8 is formed on the surface of this lamination 10 through a diffusion metal layer 7. Also, an n-side electrode 9 is formed on the n-type layer exposed by etching off a part of the semiconductor lamination 10. According to this invention, the n-side electrode 9 includes an ohmic contact electrode 91 and a bonding electrode 92, which is arranged to cover the surface and the sides of the ohmic contact electrode 91.

The semiconductor lamination 10 formed on the substrate 1 has a low-temperature buffer layer 2 of GaN, for example, deposited to the thickness of about 0.01 to 0.2 $\mu$m, and an n-type layer 3 of GaN or the like constituting a clad layer formed to the thickness of about 1 to 5 $\mu$m by epitaxial growth. Further, an active layer 4 of such a material as InGaN based compound semiconductor with the band gap energy thereof smaller than that of the clad layer is deposited to the thickness of about 0.05 to 0.3 $\mu$m, and a p-type layer (clad layer) 5 composed of a p-type AlGaN based compound semiconductor layer 5a and a GaN layer 5b is deposited to the thickness of about 0.2 to 1 $\mu$m. These layers are formed in that order sequentially. Although the p-type layer 5 is a double layer of GaN layer and AlGaN based compound semiconductor layer, only the GaN layer or the AlGaN based layer may suffice. Nevertheless, the provision of a layer containing Al is more preferable from the viewpoint of the carrier confinement effect. Similarly, the n-type layer 3 may be a double layer including an AlGaN based compound semiconductor layer. These may alternatively be formed of a different other gallium nitride based compound semiconductor layer. Further, instead of the double hetero junction structure with the active layer 4 sandwiched between the n-type layer 3 and the p-type layer 5 as in this example, other structures can be employed such as the pn junction structure with the n-type layer and the p-type layer coupled directly to each other.

The semiconductor light emitting device according to the present invention has the feature in the provision, as described above, of the bonding electrode 92 included in the n-side electrode 9 in such a manner as to cover the exposed portion of the ohmic contact electrode 91. The ohmic contact electrode 91 has a Ti layer formed to the thickness of about 0.1 $\mu$m and an Al layer formed to the thickness of about 0.5 $\mu$m and alloyed by heat treatment to the thickness of about 0.5 $\mu$m. The surface of the ohmic contact electrode 91 is deposited with a Ti layer 92a to the thickness of about 0.1 $\mu$m and an Au layer 92b to the thickness of about 0.6 $\mu$m. The whole structure, therefore, is so configured that the bonding electrode 92 about 0.7 $\mu$m thick is formed to cover also the sides of the ohmic contact electrode 91. This bonding electrode 92 is formed simultaneously with the p-side electrode 8. This avoids the increase in the number of steps and eliminates the subsequent heat treatment. Also, the metal films of the bonding electrode are not diffused to each other or with the metal of the ohmic contact electrode 91, and Ti is not deposited on the surface of the Au layer 92b.

The p-side electrode 8 preferably includes a Ti layer having a sufficient mechanical strength to support the shock of wire bonding. The bonding electrode 92, which is formed at the same time as the p-side electrode 8 and hence in double layers, but may be formed of only an Au layer. In short, the bonding electrode 92 may be a metal resistant to the change of properties such as oxidation, having a superior ability to bond with a wire such as an Au wire and having a resistance to corrosion by water, for example. In FIG. 1, numeral 11 designates wires to be bonded.

The diffusion metal layer (transparent electrode) 7 transmits the light emitted from the active layer 4 while spreading the current over the entire p-type layer 5 from the p-side electrode (bonding electrode) 8. This diffusion metal layer 7 is formed to the thickness of about 2 to 100 nm, for example, by alloying a Ni layer and an Au layer by heat treatment. It is formed to sufficiently spread the current and to transmit and produce the light from the surface thereof.

In a semiconductor light emitting device according to the present invention made of the gallium nitride based compound semiconductor, an n-side electrode 9 electrically connected to the n-type layer is formed by the ohmic cotact electrode 91 made of an Al—Ti alloy, for example, as a metal material easy enough to establish an ohmic contact with the n-type layer, and the bonding electrode 92, which covers the ohmic contact electrode 91, made of a metal layer of gold or the like resistant to oxygen and water (moisture) and superior in bonding capability. So an n-side electrode has a small contact resistance and a high reliability. Further, the bonding electrode 92 can be formed in the same process as the p-side electrode 8 without increasing the number of steps.

Now, a method of manufacturing the semiconductor light emitting device of FIG. 1 will be explained with reference to the steps shown in FIGS. 2(a) to 2(c).

Figure 2A:
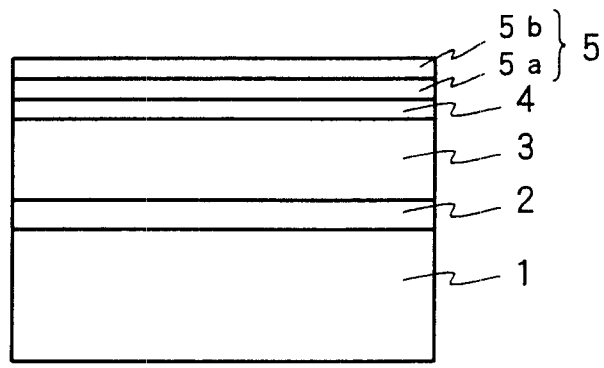
FIGS. 2(a) to 2(c) are diagrams showing the steps of manufacturing the semiconductor light emitting device of FIGS. 1(a) and 1(b) according to an embodiment of the present invention.
Figure 2B:
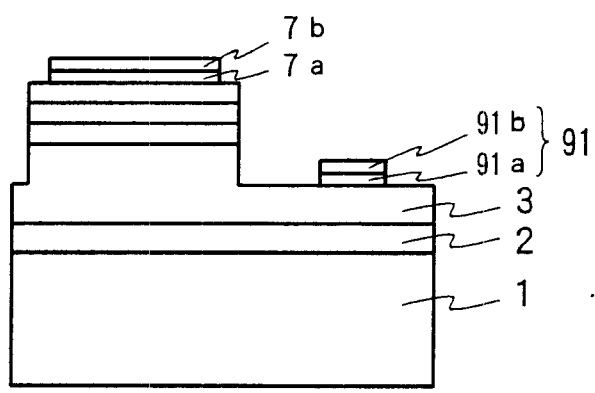
Figure 2C:
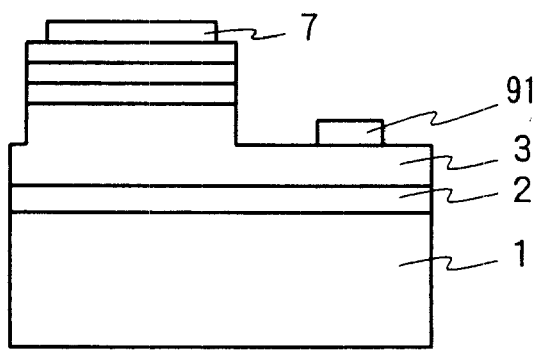

First, as shown in FIG. 2(a), reactive gases such as trimethyl gallium (TMG) and ammonia (NH$_3$), and an n-type dopant gas such as SiH$_4$ or the like are supplied together with the carrier gas H$_2$ by the metal organic chemical vapor deposition (MOCVD). Then, a low-temperature buffer layer 2 of GaN is formed by epitaxial growth to the thickness of about 0.01 to 0.2 $\mu$m at low temperature of about 400 to 600° C., and then increasing the temperature to not lower than 600° C. with the same composition, an n-type layer (clad layer) 3 is formed by epitaxial growth to the thickness of about 1 to 5 $\mu$m. After that, the supply of the dopant gas is stopped, and trimethyl indium (TMIn) is added as the reactive gas, thereby forming an active layer 4 of an InGaN based compound semiconductor to the thickness of about 0.05 to 0.3 $\mu$m.

Then, the reactive gas TMIn is changed to trimethyl aluminum (TMA), and cyclopentadiene magnesium (Cp$_2$Mg) or dimethyl zinc (DMZn) is introduced thereby to deposit a p-type AlGaN based compound semiconductor layer 5a to the thickness of about 0.1 to 0.5 $\mu$m, and further by stopping the supply of the reactive gas TMA, to deposit a p-type GaN layer 5b to the thickness of about 0.1 to 0.5 $\mu$m. In this way, a p-type layer 5 is formed.

After that, a protective film of SiN or the like is formed on the surface, and for activating the p-type dopant, annealed for about 10 to 60 minutes at about 400 to 800° C. The protective film is patterned and a part of the semiconductor lamination 10 is etched thereby to expose the n-type layer 3 as shown in FIG. 2(b). Then, a resist film is provided while the place where to form a diffusion metal layer 7 is exposed. By the lift-off method, a Ni layer 7a and an Au layer 7b, for example, are deposited by evaporation. The resist film is removed and a resist film is formed again, while exposing only the place where to form the contact electrode 91. By the lift-off method, an Al layer 91a and a Ti layer 91b are laminatedly arranged. These metal layers can alternatively be formed, however, by patterning with etching after forming a film over the entire surface thereof without using the lift-off method.

Subsequently, Ni is alloyed with Au, and Al with Ti by conducting the heat treatment at about 400 to 600° C. As a result, as shown in FIG. 2(c), an alloyed diffusion metal layer 7 is formed to the thickness of about 2 to 100 nm and an ohmic contact electrode 91 to the thickness of about 0.5 $\mu$m, respectively.

After that, a resist film is formed over the entire surface, and the place where to form the n-side electrode 9 and the place where to form the p-side electrode (bonding pad) are opened and exposed. According to the lift-off method, the Ti layers 92a, 8a having a thickness of about 0.1 $\mu$m and the Au layers 92b, 8b having a thickness of about 0.6 $\mu$m are continuously formed by vacuum evaporation or the like, and the resist film is removed. In this way, the bonding electrode 92 and the p-side electrode 8 are formed at predetermined positions, thereby producing the semiconductor light emitting device shown in FIG. 1(a). In the process, it is necessary that the resist film is patterned by aligning so that the bonding electrode 92 covers the whole ohmic contact electrode 91. In the case where the diameter of the ohmic contact electrode 91 is about 100 $\mu$m, for example, by setting the outer diameter of the bonding electrode 92 in about 110 $\mu$m, the distance between the mask diameter (outer diameter of the bonding electrode 92) and the outer diameter of the ohmic contact electrode 91 is about 5 $\mu$m.

According to the manufacturing method of the present invention, the bonding electrode 92 and the p-side electrode 8 are formed in the same process. Therefore, the bonding electrode can be formed while covering the ohmic contact electrode without increasing the number of steps. Further, if the diffusion metal layer and the ohmic contact electrode are alloyed by heat treatment at the same time, the number of steps can be reduced, and it prevents the metal of contact electrode 91 from being diffused into the surface metal layer of the bonding electrode 92, because the heat treatment is not necessary after providing the bonding electrode 92. As a result, the surface cleanliness can be maintained for an improved wire bonding characteristic and an improved reliability.

According to the present invention, the wire bonding characteristic of the n-side electrode is improved greatly. In addition, the structure in which Al or the like easily corroded is not exposed protects the electrodes from corrosion even when exposed to water (moisture) such as mold resin covering the surrounding, thereby leading to a very high reliability.

In the manufacturing method according to the present invention, a stable electrode structure in which the ohmic contact electrode is covered by the bonding electrode, can be obtained without increasing the number of steps. Also, the heat treatment is conducted in advance and therefore there is no need of heat treatment for alloying after forming the bonding electrode. Thus, a metal easily corroded is not diffused into the metal layer of the bonding electrode. As a result, the possibility of oxidation and corrosion is eliminated, and a stable electrode can be formed.

Although preferred example have been described in some detail, it is to be understood that certain changes can be made by those skilled in the art without departing from the spirit and scope of the invention as defined by the appended claims.

What is claimed is:

1. A method of manufacturing a semiconductor light emitting device, comprising the steps of:

forming a semiconductor lamination by growing semiconductor layers including an n-type layer and a p-type layer made of a gallium nitride based compound semiconductor in such a manner as to form a light emitting region on a substrate, forming an n-side electrode electrically connected to said n-type layer, by providing an ohmic contact electrode on a surface of said n-type layer and a bonding electrode in such a manner as to cover said ohmic contact electrode; and forming a p-type electrode electrically connected to said p-type layer;

wherein said p-side electrode being formed of the same material and in the same process as said bonding electrode.

2. A manufacturing method according to claim 1, wherein said semiconductor lamination is formed by growing said n-type layer, an active layer and said p-type layer in that order on said substrate, said n-type layer is exposed by etching off a part of said semiconductor lamination, and said n-side electrode is formed on a surface of said n-type layer exposed.

3. A manufacturing method according to claim 2, wherein a diffusion metal layer is formed by depositing metal layers on said semiconductor lamination and alloying said metal layers, said p-side electrode is formed on a surface of said diffusion metal layer, said contact electrode of said n-side electrode is formed by depositing and alloying metal layers, and a process for alloying said diffusion metal layer is carried out at the same time as a process for alloying said contact electrode.

4. A manufacturing method according to claim 3, wherein a Ti layer and an Al layer are deposited to form said contact electrode, a Ni layer and an Au layer are deposited to form said diffusion metal layer, said Ti layer is alloyed with said Al layer and said Ni layer is alloyed with said Au layer by heat treatment at the same time, and metal films for said bonding electrode and said p-side electrode are formed at the same time.

* * * * *